(12) United States Patent
Zhai et al.

(10) Patent No.: US 10,746,219 B2
(45) Date of Patent: Aug. 18, 2020

(54) SCREW, METHOD OF MANUFACTURING THE SAME AND RELATED STORAGE DEVICES

(71) Applicant: EMC IP Holding Company LLC, Hopkinton, MA (US)

(72) Inventors: Haifang Zhai, Shanghai (CN); David Dong, Shanghai (CN); Ricky Liu, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 16/363,567

(22) Filed: Mar. 25, 2019

(65) Prior Publication Data

US 2019/0331157 A1   Oct. 31, 2019

(30) Foreign Application Priority Data

Apr. 28, 2018   (CN) .......................... 2018 1 0397989

(51) Int. Cl.
| | | |
|---|---|---|
| *H05K 7/00* | (2006.01) | |
| *F16B 35/06* | (2006.01) | |
| *H05K 7/14* | (2006.01) | |

(52) U.S. Cl.
CPC ........... *F16B 35/06* (2013.01); *H05K 7/1417* (2013.01); *H05K 7/1427* (2013.01); *H05K 7/1489* (2013.01)

(58) Field of Classification Search
USPC ................................ 361/728, 807, 809, 810
See application file for complete search history.

(56) References Cited

U.S. PATENT DOCUMENTS

| | | | | |
|---|---|---|---|---|
| 8,432,703 B2* | 4/2013 | Lin | ........................ | H05K 7/142 361/759 |
| 9,249,821 B2* | 2/2016 | Halder | .................. | F16B 35/005 |
| 2010/0109346 A1* | 5/2010 | Dieling | ................. | B64C 1/1461 292/90 |
| 2016/0017913 A1* | 1/2016 | Guthrie | ............... | F16C 11/0614 403/77 |

* cited by examiner

*Primary Examiner* — Hung S. Bui
(74) *Attorney, Agent, or Firm* — Ryan, Mason & Lewis, LLP

(57) ABSTRACT

Embodiments of the present disclosure relate to a screw, a manufacturing method thereof and an associated storage device. The screw includes a screw stem at least partly provided with threads; and a head comprising a rolling element, the rolling element protruding out of a surface of the head and adapted to form rolling contact with an object abutting against the head. By the screw according to embodiments of the present disclosure, an effective support can be provided to the storage device, without interfering with the plug operation of the storage device.

20 Claims, 4 Drawing Sheets

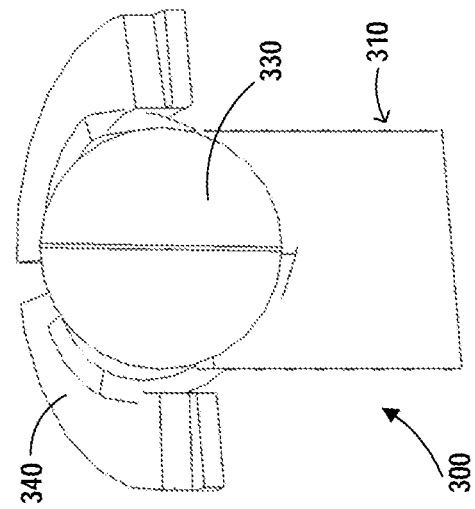
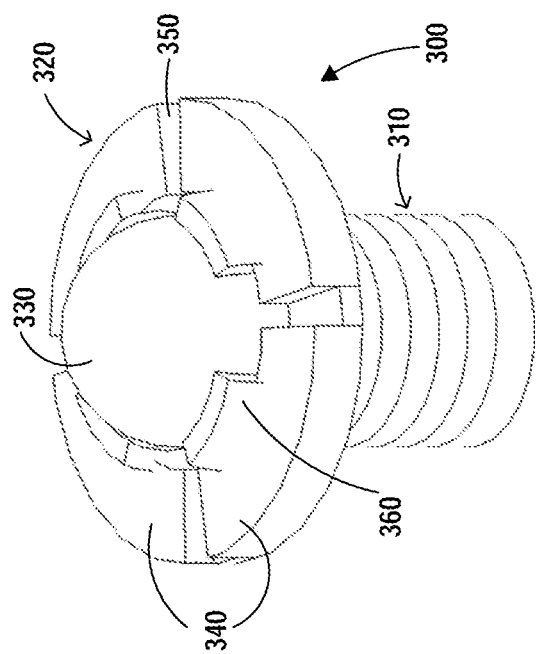

SCREW, METHOD OF MANUFACTURING THE SAME AND RELATED STORAGE DEVICES

RELATED APPLICATION(S)

The present application claims priority to Chinese Patent Application No. 201810397989.2, filed Apr. 28, 2018, and entitled "Screw, Method of Manufacturing the Same and Related Storage Devices," which is incorporated by reference herein in its entirety.

FIELD

Embodiments of the present disclosure generally relate to a storage server, and more specifically, to a screw for supporting storage nodes within a storage server.

BACKGROUND

Current storage servers typically include a plurality of stacked storage nodes. The storage nodes are received within a chassis of the storage server in a pluggable manner. With ongoing development of storage techniques, the storage server includes increasingly powerful functions, and as a result storage nodes are becoming heavier. When the chassis of the conventional storage server is used to receive storage nodes, the following technical problems exist. During use of the storage server, plastic deformation resulting from sagging occurs to the outer housing of the storage node, since the device within the outer housing is subjected to gravity for a long time period. Sagging of the outer housings of the storage nodes squeezes the gap between adjacent storage nodes and even results in scraping and interference of the adjacent storage nodes when this situation becomes worse, thus affecting plugging of the adjacent storage nodes. In addition, since the outer housings are typically made of metal, metal scraps are often produced due to scratches of the housings of the adjacent storage nodes with the sagged part, and the metal scraps may enter into the storage nodes, causing a failure of the devices within the storage nodes and damage to the storage nodes.

Conventional practice has failed to provide a suitable solution capable of overcoming the above deficiencies of the storage server. Hence, improvements to the conventional storage server are needed to improve the sagging issue.

SUMMARY

One of the objectives of the present invention is to provide a support device, so as to solve or eliminate one or more of the foregoing technical problems.

According to a first aspect of the present disclosure, there is provided a screw. The screw comprises a screw stem at least partly provided with threads; and a head comprising a rolling element, the rolling element protruding out of a surface of the head and adapted to form rolling contact with an object abutting against the head.

In some embodiments, the head is provided with a receiving cavity for receiving the rolling element.

In some embodiments, the head comprises a plurality of lobes arranged around the receiving cavity and tool grooves arranged between the plurality of lobes for screwing the screw.

In some embodiments, at least one of the plurality of lobes comprises a jaw protruding towards the receiving cavity, and the jaw is adapted to hold the rolling element in the receiving cavity when the rolling element is received in the receiving cavity.

In some embodiments, the jaw is at least partly made of elastic material such that it can be deformed during mounting of the rolling element to allow the rolling element to be placed into the receiving cavity.

In some embodiments, the rolling element is spherical.

In some embodiments, the rolling element is cylindrical.

According to a second aspect of the present disclosure, there is provided a storage node, comprising at least one circuit board and a housing for receiving the circuit board, wherein the circuit board is fixed to the housing via at least one of the screws according to the first aspect.

In some embodiments, at least a part of a head of the screw protrudes out of a housing surface so as to form rolling contact with an object contacting the housing via the head.

In some embodiments, at least one of the screws is located at or near a center of the housing.

According to a third aspect of the present disclosure, there is provided a storage server. The storage server comprises: a chassis; and at least two storage nodes being received in plugged relation within the chassis in a stacked manner, wherein at least one of the storage nodes is the storage node according to the second aspect.

In some embodiments, a head of a screw of the storage node protrudes out of a surface of the housing of the storage node to form rolling contact with a surface of a housing of an adjacent storage node.

In some embodiments, the at least two storage nodes are stacked in a vertical direction.

In some embodiments, two adjacent storage nodes of the at least two storage nodes are stacked in an upside-down manner relative to each other.

According to a fourth aspect, there is provided a method of manufacturing the screw according to the first aspect. The method comprises: providing a screw stem at least partly provided with threads; and providing a head comprising a rolling element, the rolling element protruding out of a surface of the head and adapted to form rolling contact with an object abutting against the head.

BRIEF DESCRIPTION OF THE DRAWINGS

Through the following detailed description with reference to the accompanying drawings, the above and other objectives, features, and advantages of example embodiments of the present disclosure will become more apparent. Several example embodiments of the present disclosure will be illustrated by way of example but not limitation in the drawings in which:

FIG. 4 shows a screw according to example embodiments of the present disclosure; and FIG. 5 is a longitudinal sectional view of a screw according to example embodiments of the present disclosure.

DETAILED DESCRIPTION

Figure 1:
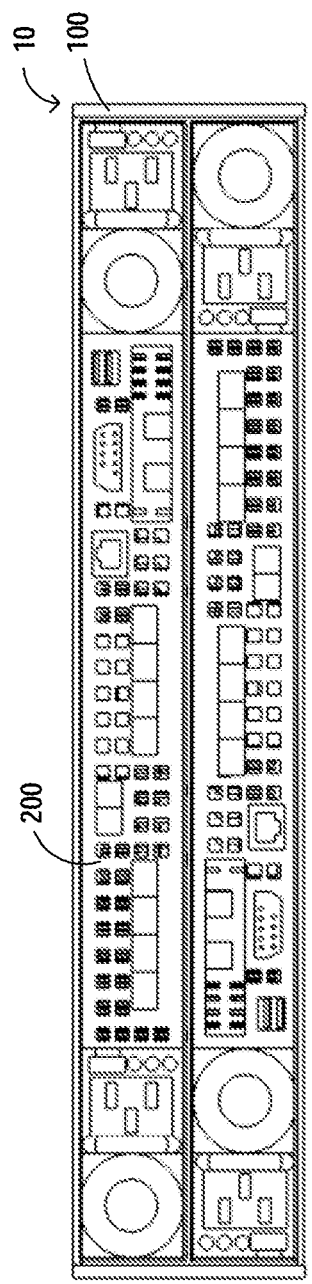
FIG. 1 shows an overall schematic structure of a storage server according to example embodiments of the present disclosure.

Principles of the present disclosure disclosed herein will now be described with reference to various example embodiments illustrated in the drawings. It should be appreciated that description of those embodiments is merely to enable those skilled in the art to better understand and further implement the present disclosure and is not intended for limiting the scope disclosed herein in any manner. It should be noted that the same or similar reference symbols are used, to the extent feasible, to denote the same or similar elements or functions. From the description below, those skilled in the art will readily envision that alternative embodiments of the structure and method as described herein can be used without departing from principles of the present invention.

The operation principles and the structure of the storage device according to the example embodiments of the present disclosure will be described below in detail with reference to the drawings. Although the storage server is taken as an example for describing the concept of the present application in the following embodiments, it is to be understood that the concept of the present application is applicable to not only a cabinet structure of a storage server, but also to a cabinet structure of a further device for receiving a plurality of devices using a plug structure, for example servers of other types, switches, routers or the like. The inventive concept of the present disclosure is applicable so long as the devices in these cabinet structures are received in a plugging manner and there is a sag issue in the devices.

As shown in FIG. 1, the storage server 10 according to embodiments of the present disclosure includes a chassis 100 and two electrical devices received in plugged relation within the chassis 100. In the example as shown, the electrical device is schematically shown as a storage node 200. This is merely illustrative; and for example, in other embodiments, the storage node 200 may be replaced by other nodes, such as a communication node, a computing node or the like, and the storage server 10 may be replaced correspondingly by a communication server, a computing server or the like. There are two storage nodes 200 in the example as shown. It is to be understood that the number of the storage nodes 200 may be set to any other number according to needs. For example, there may be more storage nodes 200 as long as support strength requirements are met. In some embodiments, the storage node 200 includes a housing which receives or is provided with a circuit board, a processor, a memory, input and output interfaces and the like. Some of these devices are typically fastened to the housing of the storage node 200 by means of screws. In some embodiments, the storage node 200 may have a more complicated structure or a simpler structure. Specific description on the structure of the storage node 200 is omitted considering that it is known in the art and is not the focus of the present application.

In some embodiments, the chassis 100 has a cuboid shape. It is to be understood that the shape of the chassis is merely illustrative and may have any other appropriate shape. The chassis 100 receives a plurality of storage nodes 200 and often operates within a room with good ventilation. In some embodiments, the chassis 100 at the inner sidewall is provided with a guide rail, and the storage node 200 is slidable along the guide rail, thereby allowing plugging in or pulling out of the chassis 100. Specific description on the structure of the chassis 100 is omitted considering that it is known in the art and is not the focus of the present application.

Typically, the storage node 200 is supported by the guide rail located at the sidewall within the chassis. With long-time use of the storage node 200, under the gravity effect of the devices within the storage node 200, a sag often occurs at the middle location of the storage node or adjacent the middle location thereof. Such a sag not only affects plugging of the adjacent storage nodes 200, but also generates a great amount of metal scraps due to interference and scratches between the housings, which may cause a failure of the electrical device within the storage node 200.

There is provided a support device according to example embodiments of the present disclosure, which can provide a support for the storage node 200.

Figure 2:
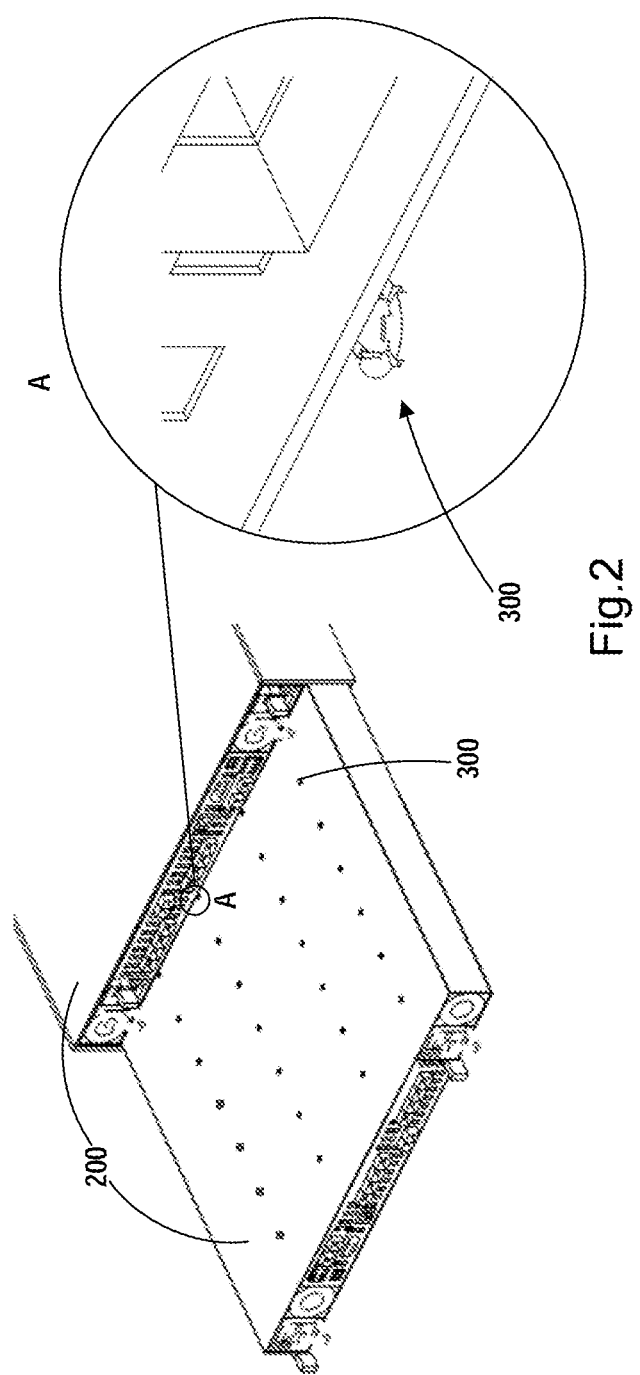
FIG. 2 is a further view of the storage server according to example embodiments of the present disclosure when a storage node is pulled out of the storage server, along with partial enlargement of a part thereof.

As shown in FIG. 2, a part of one storage node 200 in the storage server 10 is pulled out from the chassis 100, while the other storage node 200 is located in the chassis. In the embodiment as shown in FIG. 2, the storage node 200 is provided with screws 300. The screw 300 forms a support of the storage node 200. FIG. 2 at the right side illustrates an enlarged view of the part A, in which a part of the screw 300 is shown.

In the embodiment of FIG. 2, the storage node 200 is provided with a plurality of openings at predetermined locations of the outer housing for receiving screws 300. The screws 300 are disposed at some of the predetermined locations of the outer housing according to needs. It is to be understood that the predetermined locations of the outer housing are merely illustrative and the openings may be pre-formed or formed when screws are being mounted. The predetermined locations are not particularly limited in any manner, and for example can be determined according to mounting needs of internal parts of the storage node 200 and/or needs of supporting adjacent storage nodes 200.

According to embodiments of the present disclosure, the structure of the screw 300 is improved such that a part of the screw 300 occupies a gap between adjacent storage nodes 200 and provides a support for adjacent storage nodes 200 while not affecting the plug operation of storage nodes 200. In the example embodiment of the present disclosure, the screw 300 is formed in rolling contact with the outer housing of the adjacent storage node 200. In this circumstance, when the adjacent storage node 200 is plugged into or pulled out from the chassis 100, the screw 300 is formed in rolling contact with the outer housing of the storage node 200, thereby preventing interference with plug operations of the storage node 200 and thus reducing or eliminating metal scraps effectively.

In some embodiments, the screw 300 may be a fastener for fixing the electrical component within the storage node 200 to the housing of the storage node 200. In some embodiments, the electrical component may be a circuit board. It is to be understood that the electrical component may be another device of the storage node 200. In some embodiments, the screw 300 may be provided only for supporting, but not act as a fastener. In this circumstance, arrangement of the screws 300 should not interfere with mounting and operation of other devices within the storage node 200.

In some embodiments, a plurality of screws 300 may be located at the center of the housing or locations adjacent the center. As such, the sagged part of the adjacent housings can be supported effectively.

In some embodiments, the fasteners of the electrical component within the storage node 200 can all be replaced by the screws 300 according to the present disclosure. In some embodiments, some fasteners of the electrical component within the storage node 200 may employ the structure of the screw 300 according to the present disclosure.

Figure 3:
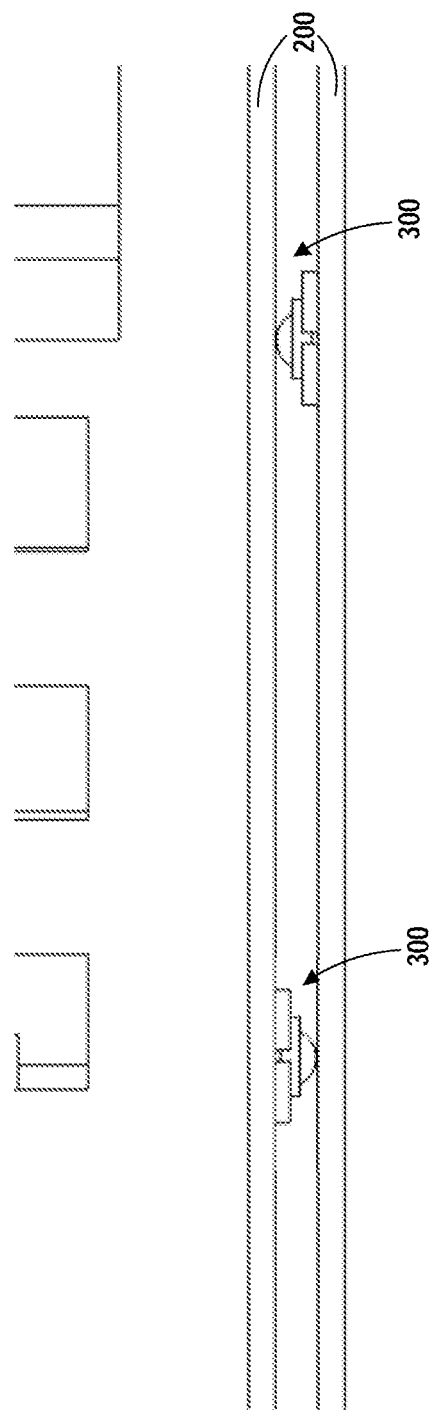
FIG. 3 is a view of two adjacent storage nodes according to example embodiments of the present disclosure.

In some embodiments, as shown in FIG. 2 through 4, the head 320 of the screw 300 of the storage node 200 can protrude out of a housing surface of the storage node 200. Hence, it forms rolling contact with the surface of a housing of the adjacent storage node 200. In some embodiments, a plurality of storage nodes 200 can be stacked in a vertical direction. In some embodiments, as shown in FIGS. 1 and 3, two adjacent storage nodes 200 are stacked in an upside-down manner relative to each other. As such, the locations of the screws 300 can be staggered, thus allowing more screws 300 to be used for supporting.

FIGS. 4 and 5 are schematic views of the screw 300 according to example embodiments of the present disclosure.

As shown, the screw 300 includes a screw stem 310 and a head 320. The screw stem 310 is provided with threads for cooperating with a respective threaded part for fixation. In some embodiments, the whole part of the screw stem 310 is provided with threads. In some embodiments, the screw stem 310 is partially provided with threads. The head 320 is provided with a rolling element 330 which protrudes out of the surface of the head 320 and is adapted to form rolling contact with an object abutting against the head 320. Since the rolling element 330 forms rolling contact with the housing of the storage node 200, the rolling element 330 will not affect the plug operation when the storage node 200 is plugged in or pulled out.

In some embodiments, the head 320 can be provided with a receiving cavity for receiving the rolling element 330. Such a structure may facilitate fixation of the rolling element 330. In some embodiments, the head 320 may be in a form of base. It is to be understood that the base may be in any appropriate form.

In some embodiments, the head 320 may include a plurality of lobes 340 which are arranged around the receiving cavity. In some embodiments, tool grooves 350 suitable for screwing the screw 300 are formed between the plurality of lobes 340. The screw 300 may be fastened by means of the screw grooves 350. In the embodiment as shown, there are four tool grooves 350 each having a straight line shape. It is to be understood that the number of the tool grooves is merely illustrative, which may be any other appropriate number. The shape of the tool groove is also merely illustrative, which may be any other appropriate shape.

In some embodiments, the lobe 340 may include a jaw 360 protruding towards the receiving cavity. The jaw 360 is adapted to fix the rolling element 330 in the receiving cavity when the rolling element 330 is received within the receiving cavity. By means of the jaw 360, the rolling element 330 can be fixed in a simple manner. In the embodiment as shown, each lobe 340 is provided with a jaw 360, which is provided as an example. It is feasible that only some lobes 340 are provided with a jaw 360. The shape of the jaw 360 is also provided as an example and can be designed appropriately according to the shape of the rolling element 330, for example. Moreover, the shapes of the jaws 360 may be varied, which may be any appropriate shapes.

In some embodiments, the jaw 360 may be at least partially formed of elastic material and thus can be deformed in a process of mounting the rolling element 330 to allow the rolling element 330 to go into the receiving cavity. In this way, simple mounting of the rolling element 330 can be accomplished. In some embodiments, the rolling element 330 is spherical. In some embodiments, the rolling element 330 is cylindrical. It is to be understood that the rolling element 330 may have any other appropriate shape capable of forming rolling contact with the contact surface.

According to a further aspect of the present disclosure, there provides a method of manufacturing the screw 300 as described above. The method includes forming a screw stem 310, wherein the screw stem 310 is at least partly provided with threads. A head 320 is formed with or receives a rolling element 330. The rolling element 330 protrudes out of a surface of the head 320 and is adapted to form rolling contact with an object abutting against the head 320.

It is to be understood by those skilled in the art that the above description is provided as an example without any intention for limitation. Those skilled in the art should be aware that the present invention may be embodied by other implementations without utilizing the same details of the particular implementations described above. In order to avoid obscuring the description of embodiments of the present invention, unnecessary details of the known functions and structures are omitted from the current description.

Although particular embodiments are illustrated and described herein, it is to be understood by those skilled in the art that any arrangement aiming to accomplish the same purpose may substitute the particular embodiments as shown herein for other embodiments, and that the present invention has other applications in other environments. The present application is intended to cover any change or variant of the present invention. The claims appended hereinafter shall not be interpreted as confining the scope of the present invention to the particular embodiments described herein.

What is claimed is:

1. A screw, comprising:
   a screw stem at least partly provided with threads; and
   a head comprising a rolling element, the rolling element protruding out of a surface of the head and adapted to form rolling contact with an object abutting against the head;
   wherein the head is provided with a receiving cavity for receiving the rolling element; and
   wherein the head comprises a plurality of lobes arranged around the receiving cavity and at least one groove arranged between adjacent lobes.

2. The screw of claim 1, wherein the head comprises a plurality grooves arranged between adjacent lobes of the plurality of lobes.

3. The screw of claim 2, wherein at least one of the plurality of lobes comprises a jaw protruding towards the receiving cavity and being configured and adapted to hold the rolling element in the receiving cavity when the rolling element is received in the receiving cavity.

4. The screw of claim 3, wherein the jaw is at least partly made of an elastic material such that the jaw is deformable during mounting of the rolling element to allow the rolling element to be placed into the receiving cavity.

5. The screw of claim 2, wherein the grooves arranged between the adjacent lobes are tool grooves configured for at least partially receiving a tool for securing the screw.

6. The screw of claim 1, wherein the rolling element is spherical.

7. The screw of claim 1, wherein the rolling element is cylindrical.

8. An apparatus comprising:
   a first storage node comprising at least one circuit board and a housing for receiving the circuit board;
   the circuit board being fixed to the housing via at least one screw, the at least one screw comprising:
      a screw stem at least partly provided with threads; and
      a head comprising a rolling element, the rolling element protruding out of a surface of the head and adapted to form rolling contact with an object abutting against the head;

wherein at least a part of the head of the at least one screw protrudes out of a surface of the housing, such that the housing forms rolling contact with an object contacting the housing via the head.

9. The apparatus of claim 8, wherein the at least one screw is located at or near a center of the housing.

10. An apparatus, comprising:
a storage server comprising a chassis;
a first storage node received in plugged relation within the chassis, the first storage node comprising at least one circuit board and a housing for receiving the circuit board, the circuit board being fixed to the housing via at least one screw, the at least one screw comprising:
 a screw stem at least partly provided with threads; and
 a head comprising a rolling element, the rolling element protruding out of a surface of the head and adapted to form rolling contact with an object abutting against the head.

11. The apparatus of claim 10, wherein the head of the at least one screw of the first storage node protrudes out of the surface of the housing of the first storage node so as to form rolling contact with a surface of a housing of an adjacent storage node.

12. The apparatus of claim 10, including at least one additional storage node received in plugged relation within the chassis.

13. The apparatus of claim 12, wherein the first storage node and the one additional storage node are received within the chassis in stacked relation.

14. The apparatus of claim 13, wherein the first storage node and the at least one additional storage node are stacked in a vertical direction.

15. The apparatus of claim 13, wherein the first storage node and the at least one additional storage node are stacked in an upside-down manner relative to each other.

16. A method of manufacturing a screw, comprising:
providing a screw stem at least partly provided with threads; and
providing a head comprising a rolling element, the rolling element protruding out of a surface of the head and adapted to form rolling contact with an object abutting against the head;
wherein the head is provided with a receiving cavity for receiving the rolling element; and
wherein the head comprises a plurality of lobes arranged around the receiving cavity and at least one groove arranged between adjacent lobes.

17. The method of claim 16, wherein the head comprises a plurality of lobes arranged around the receiving cavity and tool grooves arranged between the plurality of lobes for screwing the screw.

18. The method of claim 16, wherein at least one of the plurality of lobes comprises a jaw protruding towards the receiving cavity and being configured and adapted to hold the rolling element in the receiving cavity when the rolling element is received in the receiving cavity.

19. The method of claim 18, wherein the jaw is at least partly made of an elastic material such that the jaw is deformable during mounting of the rolling element to allow the rolling element to be placed into the receiving cavity.

20. The method of claim 16, wherein the rolling element is one of spherical and cylindrical.

* * * * *